(12) United States Patent
Houzouji et al.

(10) Patent No.: US 9,754,855 B2
(45) Date of Patent: Sep. 5, 2017

(54) SEMICONDUCTOR MODULE HAVING AN EMBEDDED METAL HEAT DISSIPATION PLATE

(71) Applicant: Hitachi, Ltd., Chiyoda-ku, Tokyo (JP)

(72) Inventors: Hiroshi Houzouji, Tokyo (JP); Akitoyo Konno, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/110,972

(22) PCT Filed: Jan. 27, 2014

(86) PCT No.: PCT/JP2014/051602
§ 371 (c)(1),
(2) Date: Jul. 12, 2016

(87) PCT Pub. No.: WO2015/111202
PCT Pub. Date: Jul. 30, 2015

(65) Prior Publication Data
US 2016/0336252 A1    Nov. 17, 2016

(51) Int. Cl.
*H01L 23/36*    (2006.01)
*H01L 23/24*    (2006.01)
(Continued)

(52) U.S. Cl.
CPC ........ *H01L 23/3675* (2013.01); *H01L 23/051* (2013.01); *H01L 23/24* (2013.01);
(Continued)

(58) Field of Classification Search
CPC ... H01L 23/3675; H01L 23/051; H01L 23/24; H01L 23/3114; H01L 23/4006;
(Continued)

(56) References Cited

U.S. PATENT DOCUMENTS 3,783,347 A * 1/1974 Vladik ................ H01L 23/3121
174/548
5,621,243 A * 4/1997 Baba ................... H01L 23/3735
257/712
(Continued)

FOREIGN PATENT DOCUMENTS

JP    2005-142323 A    6/2005
JP    2008-153464 A    7/2008
(Continued)

OTHER PUBLICATIONS

International Search Report (PCT/ISA/210) issued in PCT Application No. PCT/JP2014/051602 dated Mar. 18, 2014 with English translation (5 pages).
(Continued)

*Primary Examiner* — Ida M Soward
(74) *Attorney, Agent, or Firm* — Crowell & Moring LLP (57) ABSTRACT

An object of the present invention is to provide a semiconductor module that can improve the dissipation of heat from semiconductor elements toward a cooling body. A semiconductor module of the present invention includes a plurality of resin-molded semiconductor devices that are mounted on a single metal base and are electrically connected. The plurality of semiconductor devices each have a structure in which a metal heat dissipation plate, which is formed on a surface of an insulating substrate on the side opposite to a semiconductor-element-mount surface, is exposed from a resin mold, and the metal heat dissipation plate is embedded in each opening provided in the metal base, so that the rear surface of the metal heat dissipation plate becomes a plane to be disposed on a cooling body.

8 Claims, 7 Drawing Sheets

(51) Int. Cl.

| | | |
|---|---|---|
| *H01L 23/31* | (2006.01) | |
| *H01L 23/40* | (2006.01) | |
| *H01L 23/14* | (2006.01) | |
| *H01L 25/07* | (2006.01) | |
| *H01L 25/11* | (2006.01) | |
| *H01L 23/367* | (2006.01) | |
| *H01L 23/051* | (2006.01) | |
| *H01L 23/00* | (2006.01) | |
| *H01L 25/18* | (2006.01) | |

(52) U.S. Cl.
CPC ...... *H01L 23/3114* (2013.01); *H01L 23/4006* (2013.01); *H01L 25/072* (2013.01); *H01L 25/115* (2013.01); *H01L 23/142* (2013.01); *H01L 24/29* (2013.01); *H01L 24/32* (2013.01); *H01L 24/33* (2013.01); *H01L 24/40* (2013.01); *H01L 24/83* (2013.01); *H01L 25/18* (2013.01); *H01L 2023/405* (2013.01); *H01L 2023/4031* (2013.01); *H01L 2023/4062* (2013.01); *H01L 2224/291* (2013.01); *H01L 2224/32225* (2013.01); *H01L 2224/32245* (2013.01); *H01L 2224/33181* (2013.01); *H01L 2224/40137* (2013.01); *H01L 2224/40139* (2013.01); *H01L 2224/8384* (2013.01); *H01L 2924/13055* (2013.01); *H01L 2924/13091* (2013.01); *H01L 2924/181* (2013.01)

(58) Field of Classification Search
CPC ... H01L 25/072; H01L 25/115; H01L 23/142; H01L 2924/181; H01L 2023/405; H01L 2023/4062
See application file for complete search history.

(56) References Cited

U.S. PATENT DOCUMENTS

| | | | | |
|---|---|---|---|---|
| 6,756,667 | B2* | 6/2004 | Hiyoshi | H01L 25/072 |
| | | | | 257/584 |
| 7,671,467 | B2* | 3/2010 | Nonaka | H01L 23/057 |
| | | | | 257/711 |
| 9,048,368 | B2* | 6/2015 | Jeong | H01L 33/08 |
| 9,129,932 | B2* | 9/2015 | Hayashi | H01L 25/18 |
| 2005/0207165 | A1* | 9/2005 | Shimizu | F21L 4/00 |
| | | | | 362/362 |
| 2009/0194869 | A1* | 8/2009 | Eom | H01L 23/367 |
| | | | | 257/712 |
| 2010/0013070 | A1* | 1/2010 | Lee | H01L 23/4334 |
| | | | | 257/676 |
| 2010/0102459 | A1* | 4/2010 | Satou | H01L 23/4334 |
| | | | | 257/783 |
| 2010/0230804 | A1 | 9/2010 | Kise | |
| 2011/0031612 | A1* | 2/2011 | Mitsui | H01L 23/3107 |
| | | | | 257/713 |
| 2013/0043581 | A1* | 2/2013 | Negoro | H01L 23/13 |
| | | | | 257/712 |
| 2014/0168901 | A1* | 6/2014 | Ide | H01L 23/36 |
| | | | | 361/717 |
| 2014/0177242 | A1* | 6/2014 | Nam | H01L 33/486 |
| | | | | 362/382 |
| 2014/0313806 | A1* | 10/2014 | Shinohara | H05K 7/20927 |
| | | | | 363/141 |
| 2015/0016064 | A1* | 1/2015 | Yamamoto | H01L 23/3107 |
| | | | | 361/719 |
| 2015/0349656 | A1* | 12/2015 | Tokuyama | H01L 23/36 |
| | | | | 363/132 |

FOREIGN PATENT DOCUMENTS

| | | |
|---|---|---|
| JP | 2008-227336 A | 9/2008 |
| JP | 2009088215 A * | 4/2009 |
| JP | 2011-142124 A | 7/2011 |
| JP | 2012-174711 A | 9/2012 |
| WO | WO 2007/141987 A1 | 12/2007 |

OTHER PUBLICATIONS

Japanese-language Written Opinion (PCT/ISA/237) issued in PCT Application No. PCT/JP2014/051602 dated Mar. 18, 2014 (3 pages).

* cited by examiner

SEMICONDUCTOR MODULE HAVING AN EMBEDDED METAL HEAT DISSIPATION PLATE

TECHNICAL FIELD

The present invention relates to a semiconductor module, and in particular, to a semiconductor module that has mounted thereon a power conversion semiconductor element for controlling a motor or the like.

BACKGROUND ART

Motor drive that is used for railways, electric vehicles, or hybrid vehicles is usually controlled by a power converter (i.e., inverter). For a portion called a main circuit of the inverter, a semiconductor module is used that has mounted thereon a switching element, such as an IGBT (Insulated Gate Bipolar Transistor) or a MOSFET (Metal Oxide Semiconductor Field Effect Transistor), that controls switching of a large current, and a diode, such as a FWD (Free Wheal Diode), that releases a reverse voltage generated during a switching operation. In the field of vehicles, reductions in the size and weight of the mounted devices have been accelerated. Thus, the power density per device or per package tends to increase. Therefore, it is strongly demanded that insulation against a high voltage be secured and the heat dissipation performance be increased corresponding to the increased power density.

Patent Literature 1 discloses a semiconductor module that includes a set of semiconductor device units obtained by combining a plurality of semiconductor device units each having a sealed semiconductor chip, a wiring substrate, and a bolt fastening unit. Patent Document 1 discloses that an elastic adhesive or an elastic sheet is provided between each semiconductor device unit and the wiring substrate, so that pressure that is applied to the wiring substrate upon fastening of bolts acts equally on each semiconductor device unit, which in turn can improve the degree of contact of each semiconductor device unit with a cooling body as well as the heat dissipation performance.

CITATION LIST

Patent Literature

Patent Literature 1: JP 2011-142124 A

SUMMARY OF INVENTION

Technical Problem

As described above, when a semiconductor module is constructed by combining units each having a sealed semiconductor element, such as an IGBT, so as to improve the degree of contact of each unit with a cooling body, it becomes possible to improve the dissipation of heat from the semiconductor element. However, in Patent Document 1, the heat dissipation path from the semiconductor element of each semiconductor device unit to the cooling body includes the semiconductor element, solder, a conductive pattern, an insulating substrate, a conductive pattern, solder, and a copper block in this order, which is the same as the heat dissipation path of the conventional common semiconductor module. Thus, the heat dissipation performance within each semiconductor device unit cannot be improved.

It is an object of the present invention to solve the aforementioned problem and provide a semiconductor module that can improve the dissipation of heat toward a cooling body.

Solution to Problem

In order to solve the aforementioned problem, a semiconductor module in accordance with the present invention includes a plurality of resin-molded semiconductor devices that are mounted on a metal base and are electrically connected. The plurality of semiconductor devices each have a structure in which a metal heat dissipation plate, which is formed on a surface of an insulating substrate on a side opposite to a semiconductor-element-mount surface, is exposed from a resin mold, and the metal heat dissipation plate of each semiconductor device is embedded in an opening provided in the metal base so that a rear surface of the metal heat dissipation plate becomes a plane to be disposed on a cooling body.

According to the semiconductor module of the present invention, only an insulating substrate and a metal heat dissipation plate are provided on the heat dissipation path from a semiconductor element to a cooling body. Thus, the heat dissipation performance can be improved.

Advantageous Effects of Invention

According to the present invention, a semiconductor module can be provided that can improve the dissipation of heat toward a cooling body.

DESCRIPTION OF EMBODIMENTS

Hereinafter, embodiments of the present invention will be described with reference to the drawings.

First Embodiment

Figure 1:
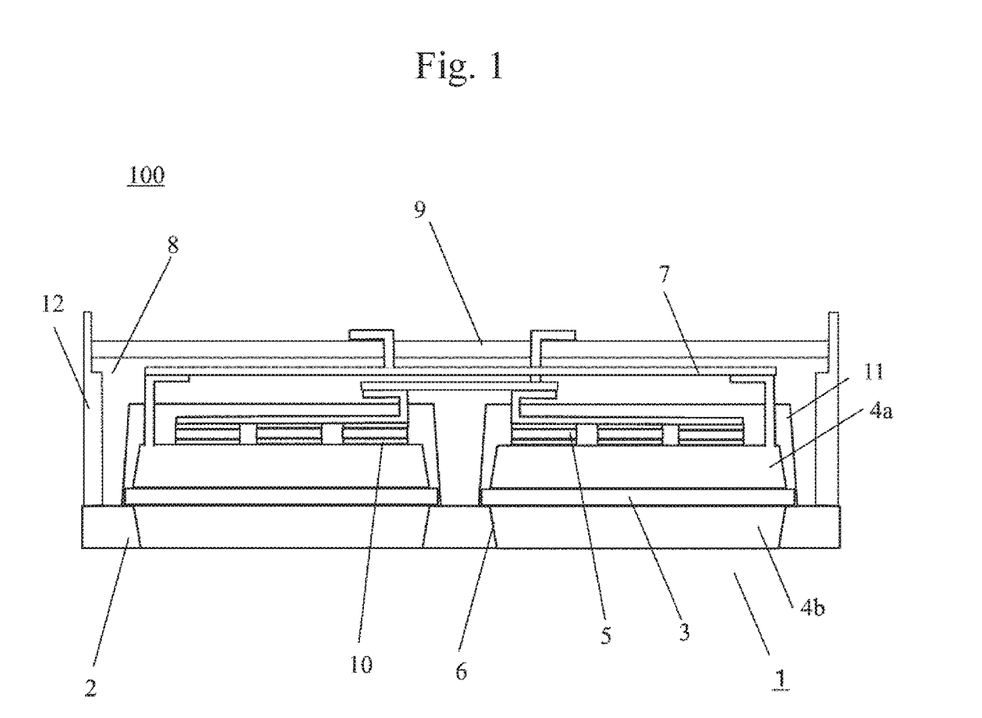
FIG. 1 shows a schematic cross-sectional view of a semiconductor module in accordance with the first embodiment of the present invention.
Figure 2:
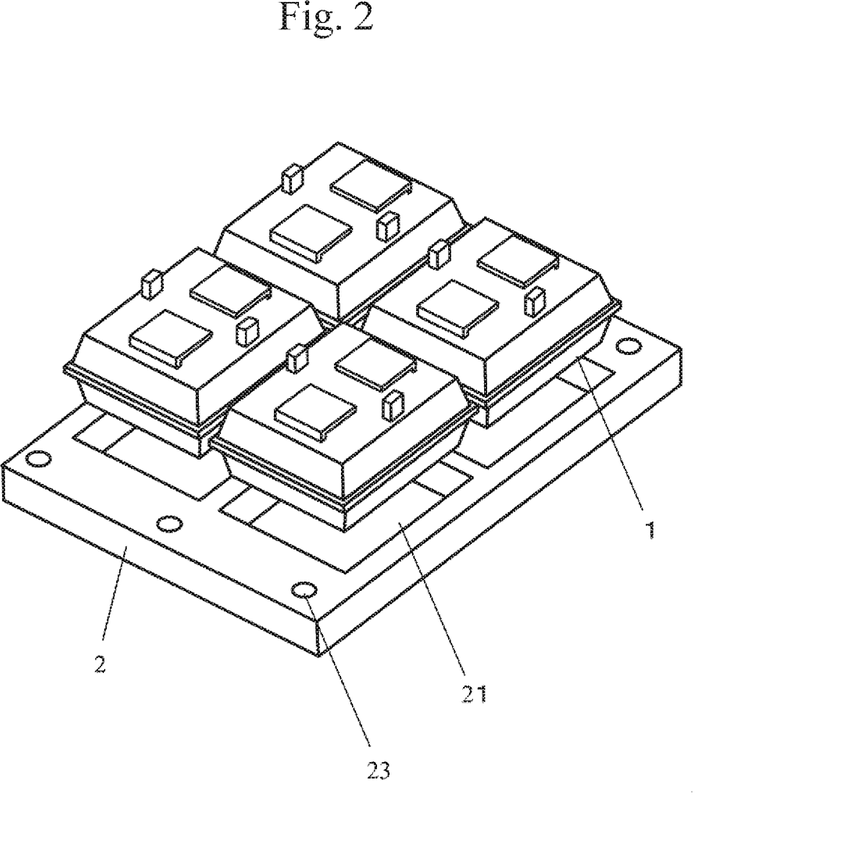
FIG. 2 is a perspective view of a main part showing the production steps of the present invention.
Figure 3:
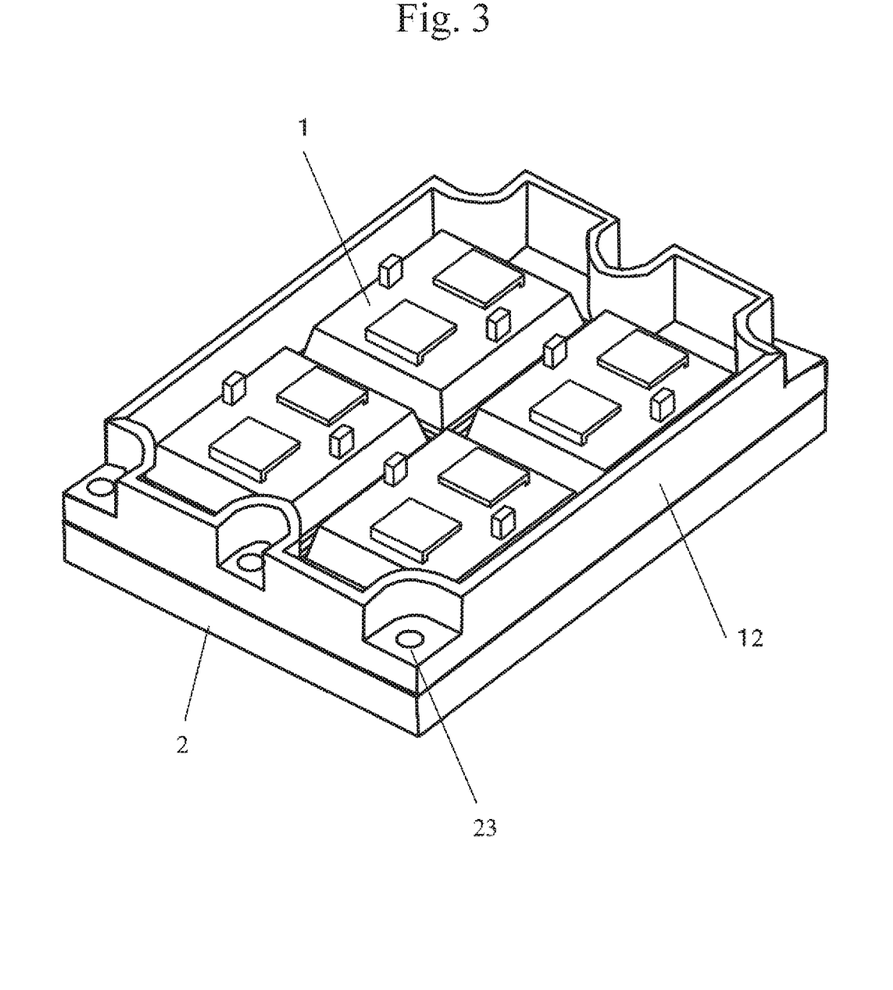
FIG. 3 is a perspective view of a main part showing the production steps of the present invention.
Figure 4:
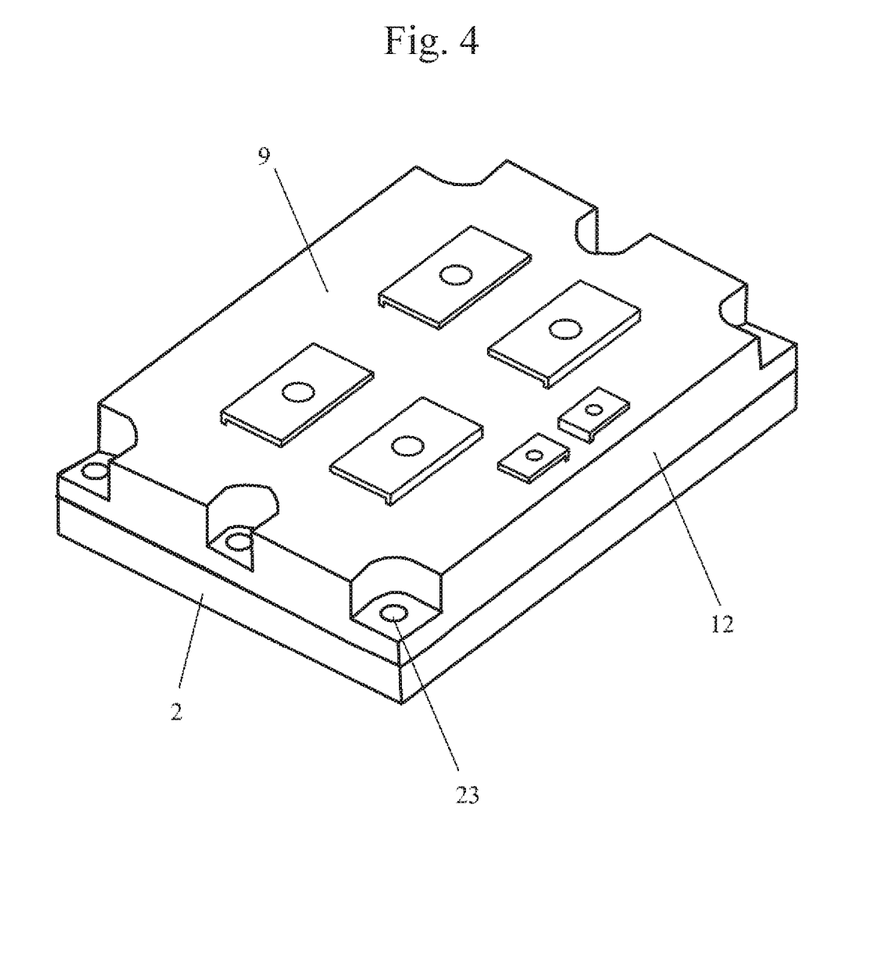
FIG. 4 is a perspective view of a main part showing the production steps of the present invention.

FIG. 1 shows a schematic cross-sectional view of a semiconductor module in accordance with the first embodiment of the present invention. FIG. 1 does not show a cross-section obtained by cutting the semiconductor module of the present invention along a specific cutting-plane line, and thus does not show connection between a control terminal or a semiconductor element in a resin seal and a wiring layer. FIGS. 2, 3, and 4 are perspective views of a main part showing the steps of producing a semiconductor module 100 in this embodiment.

The semiconductor module 100 in this embodiment includes a plurality of resin-molded semiconductor devices 1 that are mounted on a single metal base 2, and the plurality of semiconductor devices 1 are electrically connected by wires 7, thereby forming a main circuit of an inverter circuit and the like. In the semiconductor module 100 in this embodiment, the reason that the module is constructed from a combination of a plurality of resin-molded semiconductor devices is as follows. In a high-capacity power conversion power module, in particular, high insulation reliability is required. Thus, such a power module is typically gel-sealed with a sealant, such as soft silicone gel, provided in a case. Soft gel is advantageous in that it will hardly peel off even when it is subjected to a thermal stress and thus can secure insulation of a semiconductor element, a terminal, and the like, but cannot relax a thermal stress that would be applied to a peripheral connection portion of the semiconductor element. Meanwhile, resin molding can, by covering the periphery of a semiconductor element with a hard resin, suppress the distortion of a peripheral connection portion of the semiconductor element, and thus can improve the connection reliability. However, if the size of the module is increased, it would be impossible to mold the entire module with a resin and thus obtain sufficient insulation reliability. Therefore, in this embodiment, a circuit that constitutes a module is divided into a plurality of units so that a plurality of resin-molded semiconductor devices constitute the module, whereby the insulation reliability and the connection reliability are improved. Further, as a module is formed by mounting a plurality of resin-molded semiconductor devices on a single metal base, it is possible to reduce a burden on the packaging process on the customer side.

The semiconductor device 1 used for the semiconductor module 100 in this embodiment includes a wiring layer 4a on one surface of an insulating substrate 3 and a metal heat dissipation plate 4b on the other surface thereof, and has a semiconductor element 5, such as an IGBT or a diode, mounted on the wiring layer 4 with solder 10 interposed therebetween. The semiconductor device 1 is a single-side-molded type where a semiconductor-element-mount surface of the insulating substrate 3 is sealed with a sealing resin 11, while the metal heat dissipation plate 4b on the rear surface side of the insulating substrate 3 is exposed. Herein, the insulating substrate 3 is formed of ceramics, such as alumina, aluminum nitride, or silicon nitride, and the wiring layer 4a and the metal heat dissipation plate 4b are each formed of copper, aluminum, or the like. The wiring layer may be used after its surface is subjected to nickel plating, for example, as appropriate. A joining material for connecting the semiconductor element 5 and the wiring layer 4a is not limited to solder. For example, a joining material that uses low temperature sintering of metallic particles may be used.

The metal base 2 is provided with a plurality of openings 21 each corresponding to the shape of the metal heat dissipation plate 4b. As shown in FIG. 2, the metal heat dissipation plate 4b of the semiconductor device 1 is embedded in each opening 21 of the metal base 2, so that a plurality of semiconductor devices 1 are mounted on the metal base 2. At this time, the insulating substrate 3 is formed larger than the metal heat dissipation plate 4b so that the semiconductor device 1 is prevented from falling off the opening 21. In addition, as shown in FIG. 1, if the metal heat dissipation plate 4b and the opening 21 are each formed in a tapered shape such that the opening on the side of the semiconductor-element-mount surface of the metal base 2 becomes wider, it is also possible to prevent the falling of the semiconductor device 1.

Next, as shown in FIG. 3, a case 12 is fixed to the metal base housing 2. Each semiconductor device 1 includes an outside connection terminal that is electrically connected to the electrode of the semiconductor element 5 and the wiring layer. Such outside connection terminal and the wire 7 are connected so that the plurality of semiconductor devices 1 are electrically wired. After that, the inside of the case 12 is filled with an insulating sealant 8, and a lid 9 is provided so that a necessary portion of the wire 7 is exposed, whereby the semiconductor module 100 shown in FIGS. 1 and 4 is obtained. The semiconductor module 100 in this embodiment has bolt through-holes 23 provided in the metal base 2 and the case 12 for fixing the semiconductor module to a cooling body. Thus, the semiconductor module 100 is fixed to a cooling body as bolts are fastened through the bolt through-holes 23. It is also possible to provide the bolt through-holes 23 in only one of the metal base 2 or the case 12 by changing the arrangement and/or the shape of the metal base 2 and/or the case 12. For the insulating sealant 8 used for the sealing process after the wiring of the semiconductor devices 1, it is possible to use a soft resin, such as silicone gel, or a hard resin, such as epoxy resin, phenol resin, or urethane resin. As described above, resin-molded semiconductor devices have high connection reliability, but may have decreased insulation reliability when peeling occurs between a molding resin and other members. The semiconductor module in this embodiment adopts a configuration in which the inside of a housing, which is formed by the metal base 2 and the case (i.e., the case 12 and the lid 9), is filled with the insulating sealant 8 in order to secure insulation between the wires 7 and thus improve the insulation reliability of the molded semiconductor devices.

According to the semiconductor module in this embodiment, the single-side-molded semiconductor device 1 is mounted on each opening 21 of the base substrate 2, whereby a structure is obtained in which the metal heat dissipation plate 4b on the rear surface of the insulating substrate 3 is exposed on the rear surface side of the base substrate 2. Thus, the rear surface of the metal heat dissipation plate 4b becomes a plane to be disposed on a cooling body. Consequently, the metal heat dissipation plate 4b can be tightly attached to the cooling body directly. On the heat dissipation path from the semiconductor element 5, such as an IGBT, to the cooling body, there is no joined portion between the metal base and the semiconductor device, such as solder with low thermal conductivity or a resin adhesive layer. Thus, cooling can be performed with high efficiency. At this time, the rear surface of the metal base 2 is desirably made flush with the rear surface of the metal heat dissipation plate 4. Alternatively, the rear surface of the metal base 2 need not be flush with the rear surface of the metal heat dissipation plate 4 if the metal heat dissipation plate 4 can be tightly attached to the cooling body with a devised shape of the cooling body.

According to the semiconductor module in this embodiment, there is no joined portion between the metal base and the semiconductor device on the heat dissipation path. Thus, it is possible to provide a semiconductor module that has low thermal resistance and high reliability and is not likely to be influenced by deterioration, which would otherwise occur due to thermal fatigue of a joined portion during operation.

Second Embodiment

Figure 5:
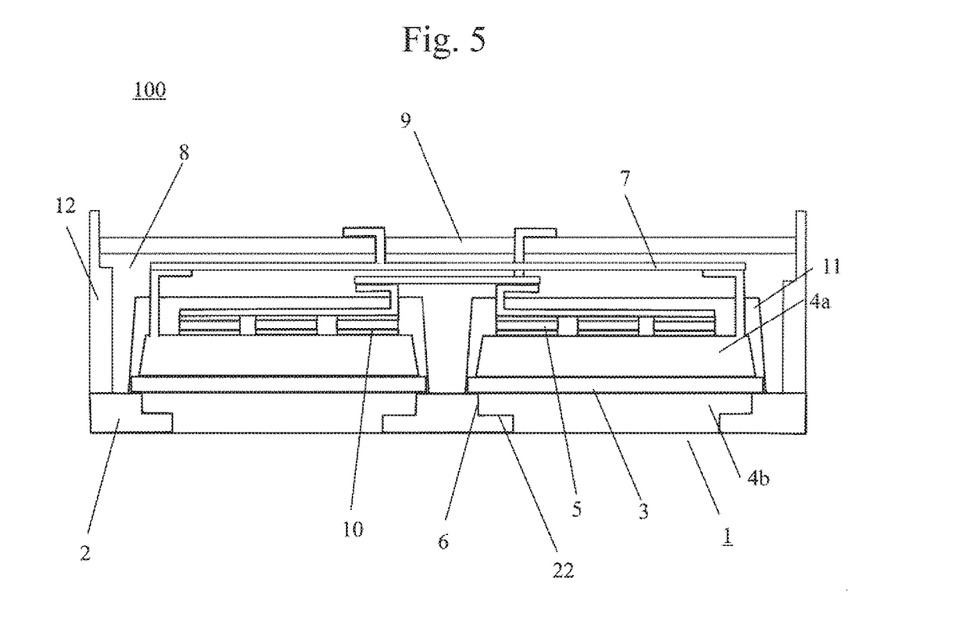
FIG. 5 is a schematic cross-sectional view of a semiconductor module in the second embodiment of the present invention.

FIG. 5 is a schematic cross-sectional view showing the second embodiment related to another method for fixing and connecting the semiconductor device 1 and the metal base housing 2 of the present invention.

A portion where the semiconductor device 1 is fastened to the metal base 2 may have any structure as long as the semiconductor device 1 is prevented from falling off the metal base 2. Thus, it is possible to, as shown in the schematic cross-sectional view of FIG. 1, provide a taper such that the opening becomes wider in the direction in which the semiconductor device is mounted or, as shown in FIG. 5, provide a step 22 to fix the semiconductor device 1 to the metal base housing 2.

Herein, the semiconductor module 100 is fixed to a cooling body (not shown) with screws passed through the bolt through-holes 23 shown in FIG. 4. At this time, if the semiconductor device 1 is pressed against the cooling body such that the semiconductor device 1 is tightly attached to the cooling body, the dissipation of heat from the semiconductor device 1 is improved. However, there may be cases where the semiconductor device 1 floats off the metal base 2 due to a thermal stress and the like during operation of the semiconductor device 1, and the degree of contact between the metal heat dissipation plate 4 and the cooling body thus becomes insufficient. As a countermeasure against this, if a fastening portion 6 is formed by joining a side surface of the opening of the metal base 2 to a side surface of the metal heat dissipation plate 4 using a joining material, it is possible to prevent the floating of the semiconductor device 1. For joining the semiconductor device 1 to the metal base 2, it is possible to use solder that contains lead, tin, copper, silver, or the like as a main component, a sealant containing silicone resin or the like, or sinterable metallic powder.

Third Embodiment

Figure 6:
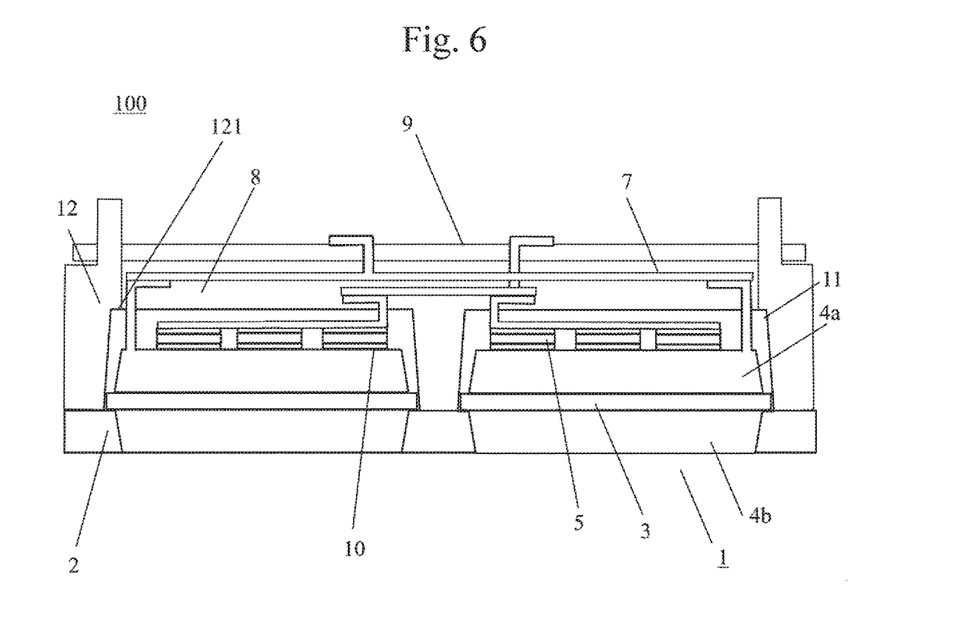
FIG. 6 is a schematic cross-sectional view of a semiconductor module in the third embodiment of the present invention.

FIG. 6 is a schematic cross-sectional view showing the third embodiment related to another method for fixing the semiconductor device 1 to prevent the floating of the semiconductor device 1 off the metal base 2. In FIG. 6, a protrusion 121 is provided on the case that is fixed to the metal base 2. With the protrusion 121, the semiconductor device 1 is pressed against the metal base 2. Further, as shown in FIG. 4, when the semiconductor device 1 is fixed to a cooling body with screws passed through the bolt through-holes 23 in the metal base 2 and the case 12, a load is applied to the metal base side of the case 12. Consequently, a force that presses the semiconductor device 1 against the metal base is applied from the protrusion 12, and thus, the degree of contact between the cooling body and the semiconductor device 1 can be improved.

The protrusion 121 may be provided such that it presses the semiconductor device 1 not only at the outer peripheral portion but also at the inner peripheral portion.

Fourth Embodiment

Figure 7:
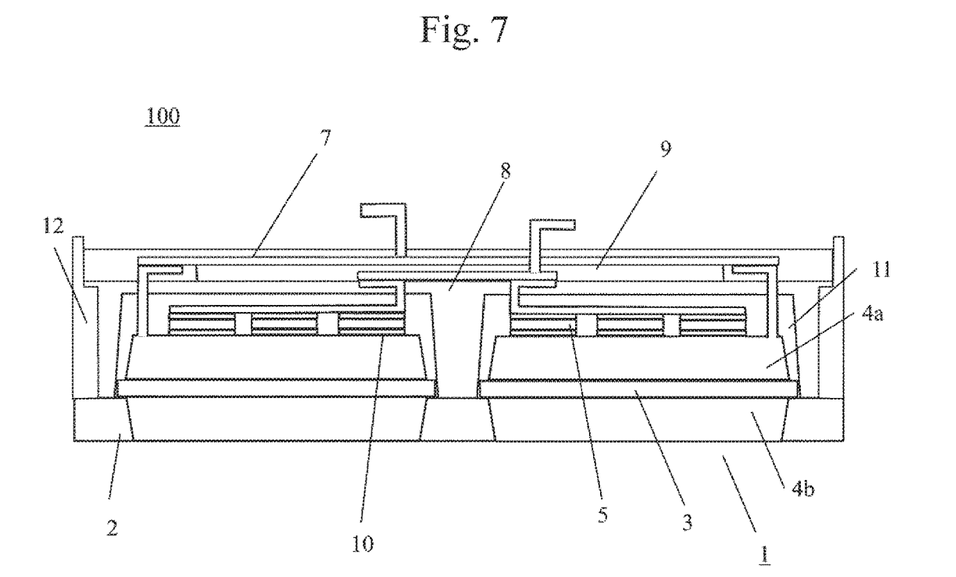
FIG. 7 is a schematic cross-sectional view of a semiconductor module in the fourth embodiment of the present invention.

FIG. 7 is a schematic cross-sectional view showing the fourth embodiment related to another method for connecting the wires 7 that connect the plurality of semiconductor devices 1 together.

As a large current flows between the plurality of semiconductor devices 1, it is desirable to reduce the inductance at wire portions that connect the semiconductor devices 1 in order to improve the properties of the semiconductor module 100. Herein, in the semiconductor module 100 in this embodiment, the wire 7 for electrically connecting the semiconductor devices 1 together is provided in the lid 9 in advance. The wire 7 provided in the lid 9 is connected to the outside connection terminal of each semiconductor device 1, so that the plurality of semiconductor devices 1 are electrically wired. It should be noted that the connection between the outside connection terminal of the semiconductor device 1 and the inner-layer wire of the lid 9 is performed by providing an opening in the lid 9 such that a portion to be connected of the inner-layer wire is exposed.

As described above, adopting a structure in which the lid 9 is integrated with a wire can reduce the mutual inductance between wires due to a magnetic field that is generated by a current.

Fifth Embodiment

Figure 8:
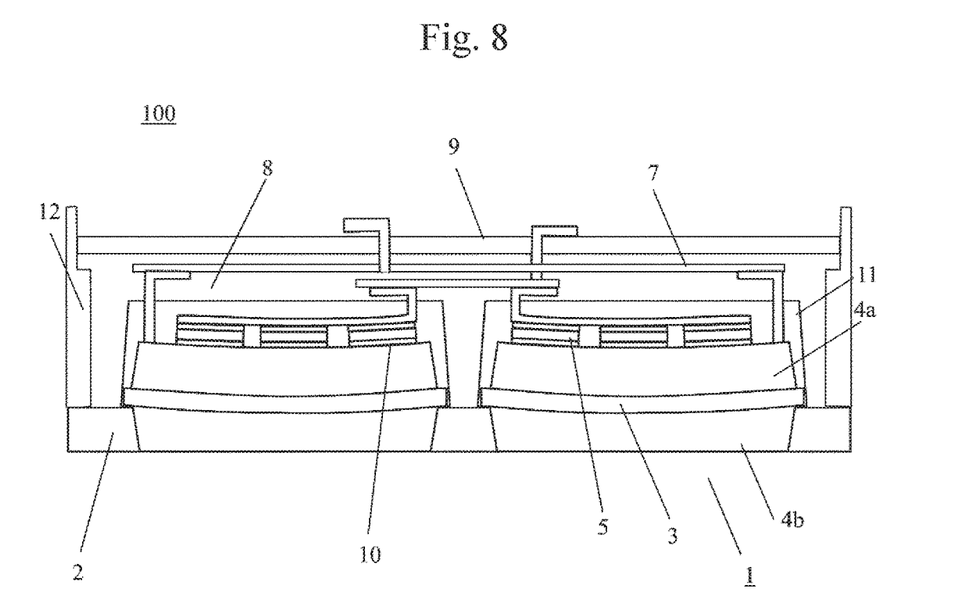
FIG. 8 is a schematic cross-sectional view of a semiconductor module in the fifth embodiment of the present invention.

FIG. 8 is a schematic cross-sectional view showing the fifth embodiment related to the metal heat dissipation plate 4b formed on the insulating substrate in the present invention.

In this embodiment, the metal heat dissipation plate 4b to be in contact with a cooling body is formed such that it is thicker at its end portions than at its center. The amount of heat generated in the semiconductor device 1 tends to be larger at its center. As a countermeasure against this, forming the metal heat dissipation plate 4h such that it is thinner at its center in the semiconductor device 1 as in this embodiment can reduce the thermal resistance at the center, and consequently reduce the concentration of heat at the center.

Sixth Embodiment

Figure 9:
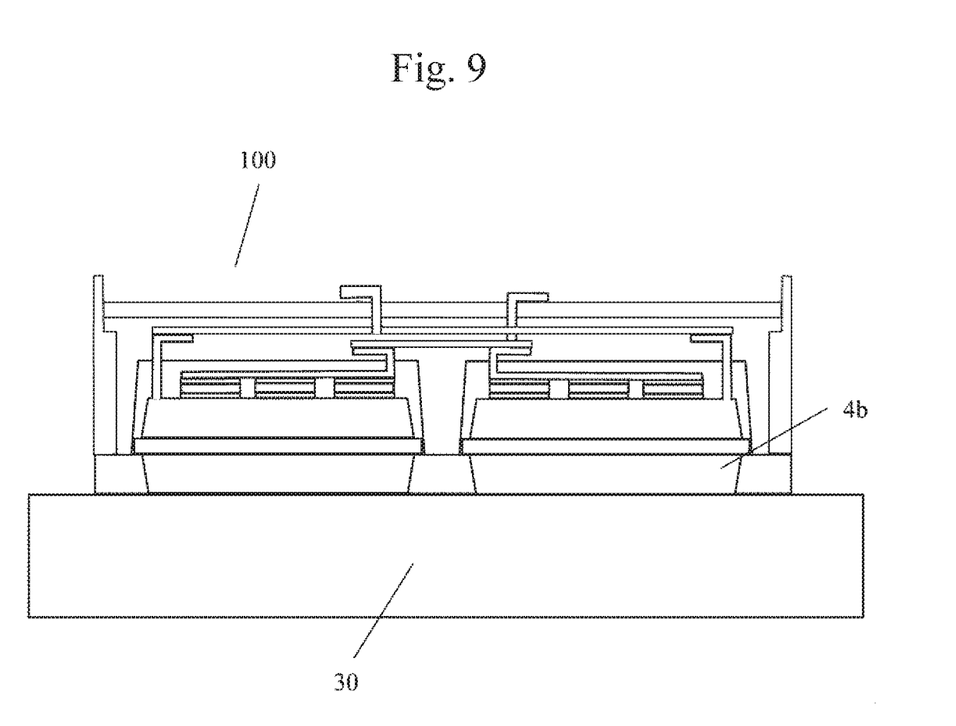
FIG. 9 is a schematic cross-sectional view when the semiconductor module of the present invention is mounted on a cooling body 30.

FIG. 9 is a schematic cross-sectional view when the semiconductor module 100 is mounted on a cooling body 30. The semiconductor module 100 is used by being mounted on the cooling body 30. During operation, the temperature of the semiconductor device 1 increases, and a temperature difference is thus generated between the cooling body 30 and the semiconductor device 1. At this time, if the materials of the cooling body 30 and the metal heat dissipation plate 4b of the semiconductor device 1 are different, there is a possibility that a gap may be generated between the two tightly attached surfaces due to the difference in the coefficient of thermal expansion resulting from the temperature difference and the difference in the materials used. Thus, in order to reduce such a gap, it is effective to form the metal heat dissipation plate 4b, which is to be in contact with the cooling body 30, of the semiconductor device 1, and the cooling body 30 using the same material. At this time, the wiring layer 4a and the metal heat dissipation plate 4b that are provided on the opposite surfaces of the insulating substrate 3 may be formed with the same material, or only the metal heat dissipation plate 4b may be formed with the same material as the cooling body 30.

Although the embodiments of the present invention have been specifically described with reference to the drawings, the present invention is not limited to the scope described in the aforementioned embodiments, and can be changed without departing from the scope of the invention.

REFERENCE SIGNS LIST

1 Semiconductor device
2 Metal base

3 Insulating layer
4a Wiring layer
4b Metal heat dissipation plate
5 Semiconductor element
6 Fastening portion
7 Wire
8 Insulating sealant
9 Lid
10 Solder
11 Sealing resin
12 Case
21 Opening
22 Step
23 Bolt through-hole
30 Cooling body
100 Semiconductor module
121 Protrusion

The invention claimed is:

1. A semiconductor module comprising:
a plurality of resin-molded semiconductor devices that are electrically connected, wherein
the plurality of resin-molded semiconductor devices are mounted on a metal base,
the plurality of resin-molded semiconductor devices each have a structure in which a metal heat dissipation plate, which is formed on a surface of an insulating substrate on a side opposite to a semiconductor-element-mount surface, is exposed from a resin mold,
the metal heat dissipation plate of each resin-molded semiconductor device is embedded in an opening provided in the metal base, and
a rear surface of the metal heat dissipation plate becomes a plane to be disposed on a cooling body.

2. The semiconductor module according to claim 1, further comprising:
a housing including the metal base and a case, the housing covering the plurality of resin-molded semiconductor devices; and
an insulating sealant that fills an inside of the housing such that the insulating sealant covers the plurality of resin-molded semiconductor devices in the housing.

3. The semiconductor module according to claim 2, wherein the insulating sealant is in a gel state.

4. The semiconductor module according to claim 1, wherein the opening in the metal base has a tapered shape or a step-like shape such that an opening on a side of the semiconductor-element-mount surface is wider than on a side opposite thereto.

5. The semiconductor module according to claim 1, wherein the opening in the metal base and a side surface of the metal heat dissipation plate are joined by a joining material.

6. The semiconductor module according to claim 2, wherein the case includes bolt through-holes for fixing the semiconductor module to the cooling body, and a protrusion that holds the resin-molded semiconductor device, and the protrusion has a structure that allows the resin-molded semiconductor device to be pressed against the metal base when the case is fastened with bolts.

7. The semiconductor module according to claim 2, wherein the plurality of resin-molded semiconductor devices are connected with a wire that is integrated with a lid portion of the case.

8. The semiconductor module according to claim 1, wherein the metal heat dissipation plate is thicker at its end portions than at its center.

* * * * *